(12) United States Patent
Kadowaki et al.

(10) Patent No.: US 12,388,234 B2
(45) Date of Patent: Aug. 12, 2025

(54) SEMICONDUCTOR LASER AND METHOD OF MANUFACTURING SEMICONDUCTOR LASER

(71) Applicant: Sony Group Corporation, Tokyo (JP)

(72) Inventors: Yasuhiro Kadowaki, Kumamoto (JP); Hideki Watanabe, Kumamoto (JP)

(73) Assignee: Sony Group Corporation, Tokyo (JP)

( * ) Notice: Subject to any disclaimer, the term of this patent is extended or adjusted under 35 U.S.C. 154(b) by 273 days.

(21) Appl. No.: 17/768,286

(22) PCT Filed: Nov. 12, 2020

(86) PCT No.: PCT/JP2020/042260
§ 371 (c)(1),
(2) Date: Apr. 12, 2022

(87) PCT Pub. No.: WO2021/100604
PCT Pub. Date: May 27, 2021

(65) Prior Publication Data
US 2024/0136790 A1  Apr. 25, 2024
US 2024/0235154 A9  Jul. 11, 2024

(30) Foreign Application Priority Data

Nov. 21, 2019 (JP) .................. 2019-210558

(51) Int. Cl.
*H01S 5/10* (2021.01)
*H01S 5/02* (2006.01)
(Continued)

(52) U.S. Cl.
CPC .......... *H01S 5/1082* (2013.01); *H01S 5/0202* (2013.01); *H01S 5/22* (2013.01); *H01S 5/34333* (2013.01); *H01S 5/34346* (2013.01)

(58) Field of Classification Search
CPC ........ H01S 5/1082; H01S 5/0202; H01S 5/22; H01S 5/34333; H01S 5/34346; H01S 5/028; H01S 5/2009; H01S 5/320275
See application file for complete search history.

(56) References Cited

U.S. PATENT DOCUMENTS 4,780,879 A * 10/1988 Chinone ............... H01S 5/0267
372/92
8,265,113 B2  9/2012 Yoshizumi et al.
(Continued)

FOREIGN PATENT DOCUMENTS

CN   107849448 A *  3/2018  ........... A61B 1/0653
JP   S62213188 A      9/1987
(Continued)

OTHER PUBLICATIONS

Machine translation of CN 107849448 A (Year: 2018).*
(Continued)

*Primary Examiner* — Yuanda Zhang
(74) *Attorney, Agent, or Firm* — K&L Gates LLP

(57) ABSTRACT

A semiconductor laser including: a stacked body in which a first cladding layer of a first conductivity type, a second cladding layer of a second conductivity type, and a light emission layer provided between the first cladding layer and the second cladding layer are stacked on a semiconductor substrate; and a ridge part provided as a projection structure extending in one direction at a top surface in a stacking direction of the stacked body, in which the stacked body is provided to have both end surfaces in the extending direction of the ridge part that each have a shape including an arc in a plan view of the stacked body from the top surface.

15 Claims, 7 Drawing Sheets

(51) Int. Cl.
*H01S 5/22* (2006.01)
*H01S 5/343* (2006.01)

(56) References Cited

U.S. PATENT DOCUMENTS

| | | | |
|---|---|---|---|
| 2004/0102764 A1* | 5/2004 | Balling | A61F 9/00825 606/5 |
| 2005/0254538 A1* | 11/2005 | Asatsuma | H01S 5/1082 372/45.01 |
| 2009/0185594 A1* | 7/2009 | Hiroyama | H01S 5/34333 372/45.01 |
| 2011/0128983 A1* | 6/2011 | Takagi | H01S 5/34333 438/33 |
| 2012/0167649 A1 | 7/2012 | Bammer | |
| 2012/0261678 A1 | 10/2012 | Hiraiwa et al. | |
| 2019/0148911 A1* | 5/2019 | Lin | H01S 5/1082 372/43.01 |
| 2019/0173262 A1 | 6/2019 | Ono et al. | |
| 2021/0281050 A1 | 9/2021 | Kadowaki | |

FOREIGN PATENT DOCUMENTS

| | | |
|---|---|---|
| JP | H05-102603 A | 4/1993 |
| JP | 2011-119360 A | 6/2011 |
| JP | 2011-135016 A | 7/2011 |
| JP | 2012-227187 A | 11/2012 |
| WO | WO2018/020793 A1 | 2/2018 |
| WO | WO2018/037747 A1 | 3/2018 |

OTHER PUBLICATIONS

International Search Report issued in International Patent Application No. PCT/JP2020/042260 on Feb. 2, 2021 and English translation of same. 7 pages.

Written Opinion issued in International Patent Application No. PCT/JP2020/042260 on Feb. 2, 2021. 4 pages.

Salzman J et al: "Modal Properties of Unstable Resonator Semiconductor Lasers With a Lateral Waveguide", Applied Physics Letters, American Institute of Physics, 2 Huntington Quadrangle, Melville, NY 11747, vol. 47, No. 5, Sep. 1, 1985 (Sep. 1, 1985), pp. 445-447, XP000706650, ISSN: 0003-6951, DOI: 10.1063/1.96141.

* cited by examiner

[ FIG. 1 ]
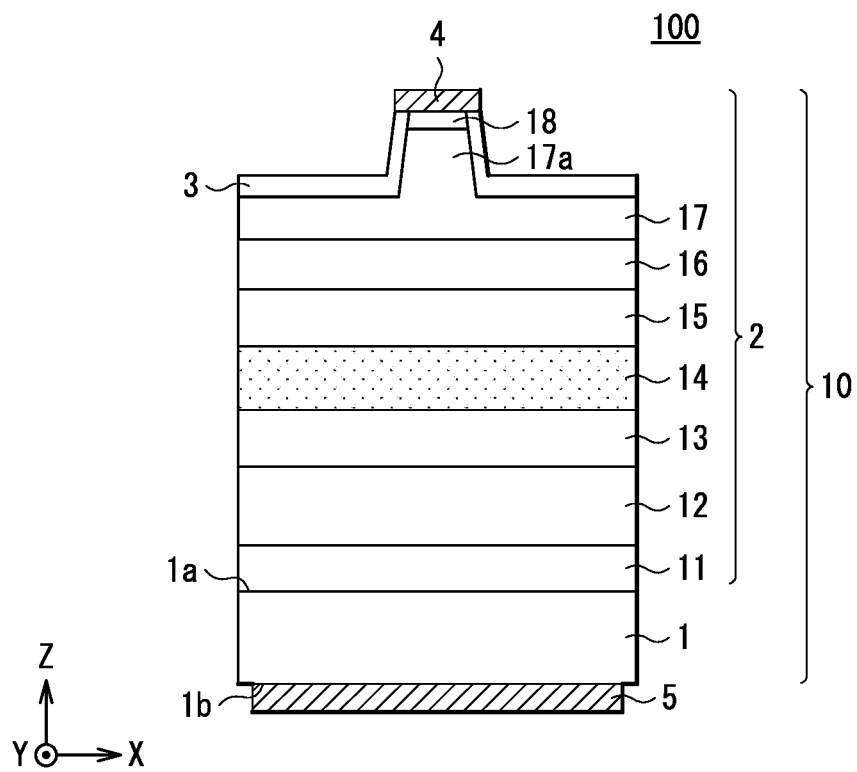
[ FIG. 2 ]
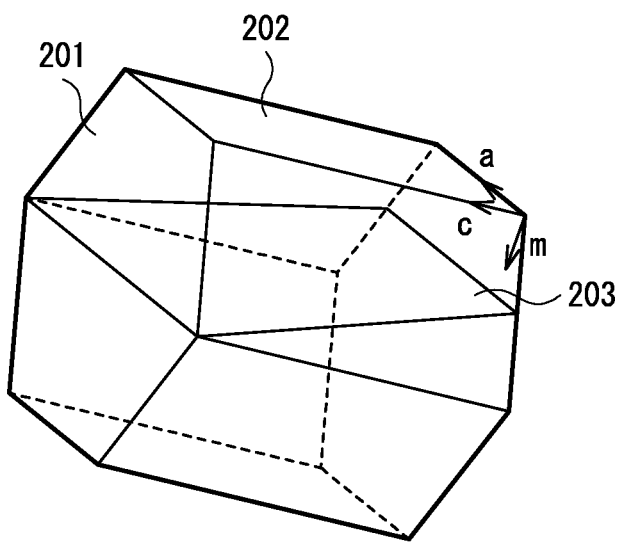

[ FIG. 3 ]
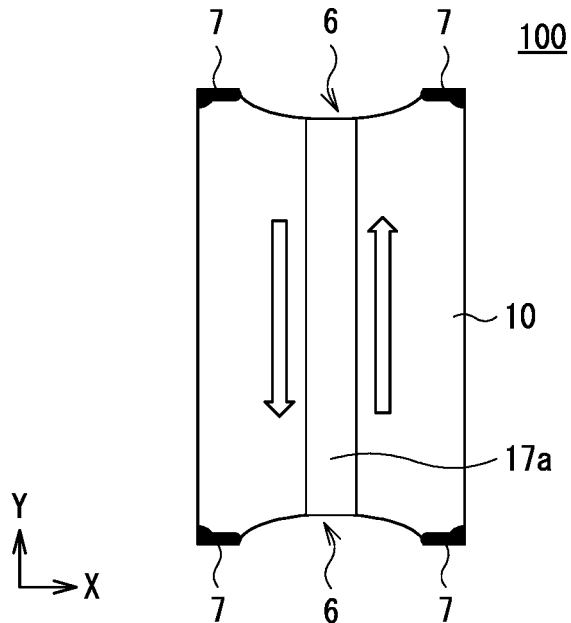
[ FIG. 4A ]
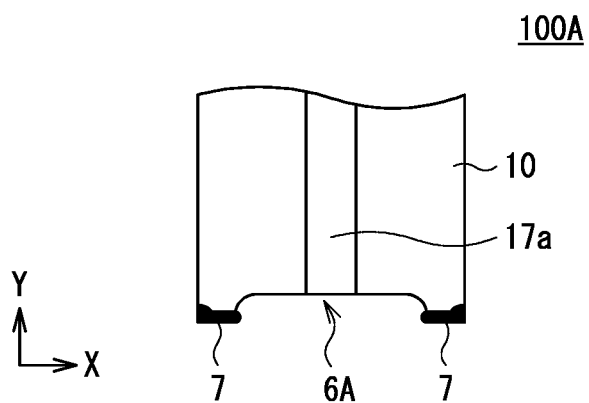
[ FIG. 4B ]
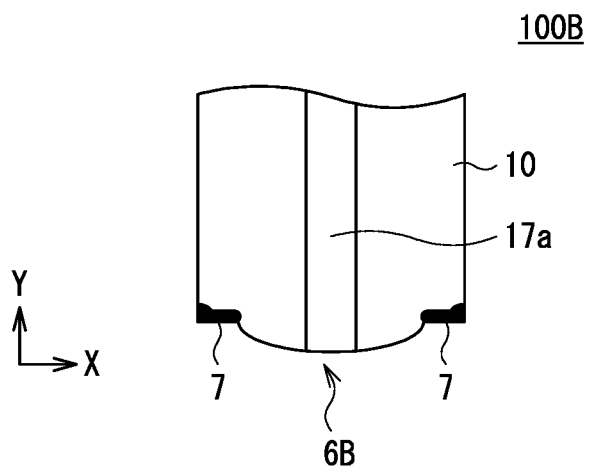

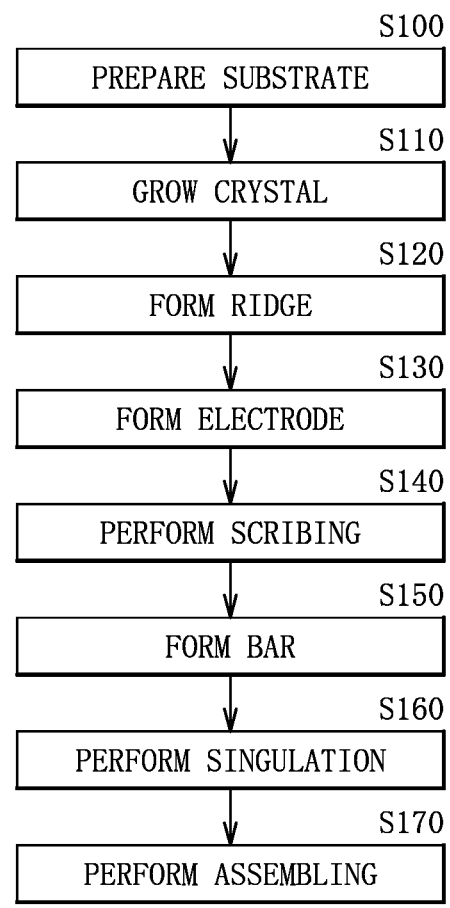
[ FIG. 5 ]

[ FIG. 6 ]
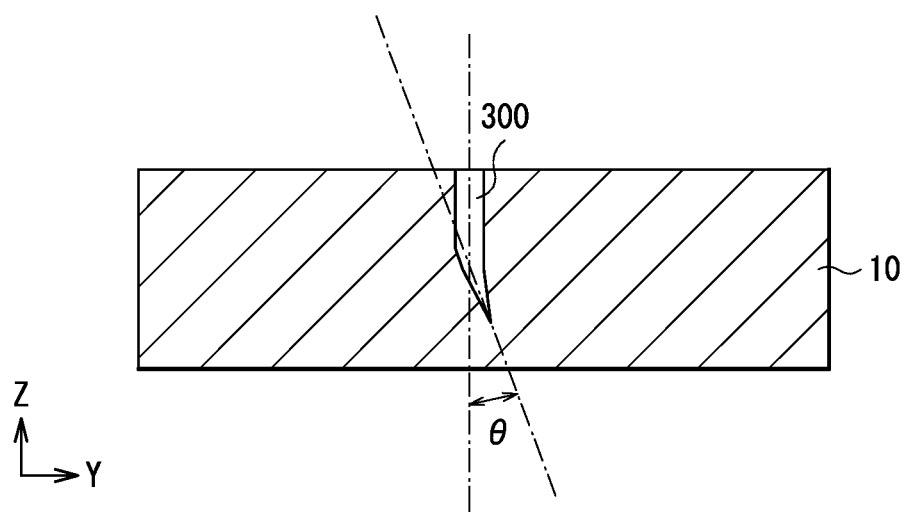
[ FIG. 7 ]
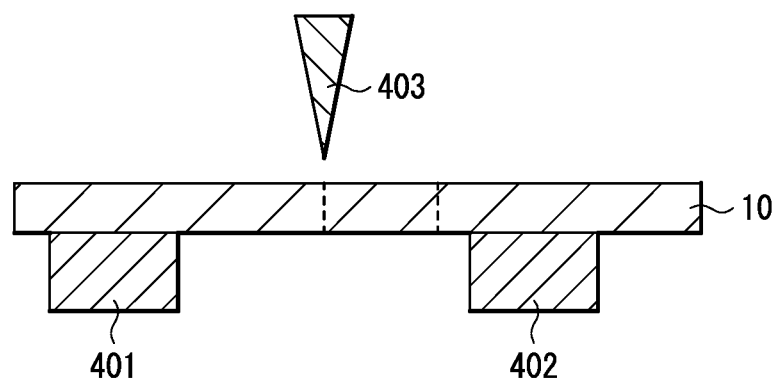

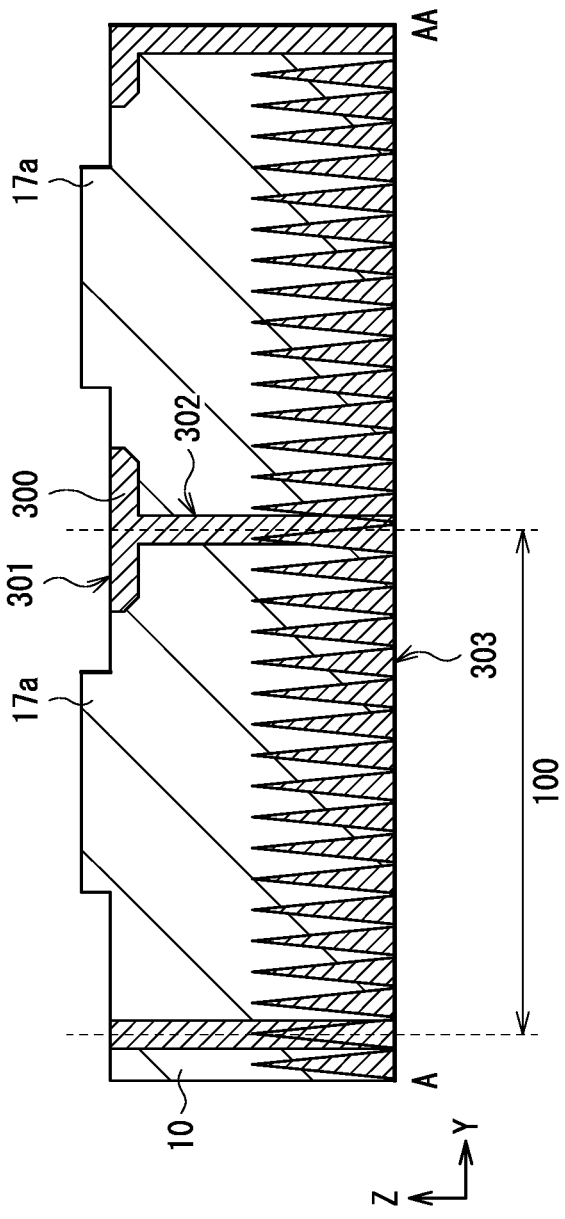
[ FIG. 8 ]

[ FIG. 9 ]
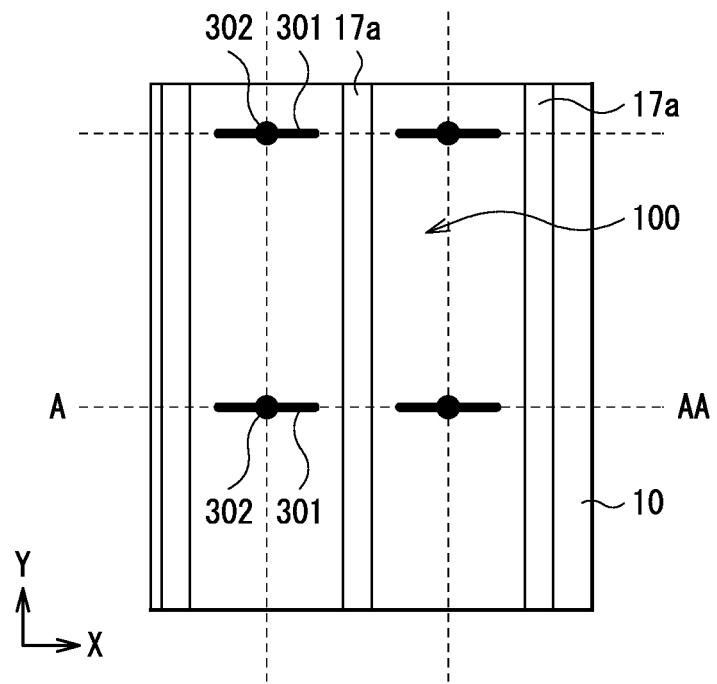
[ FIG. 10 ]
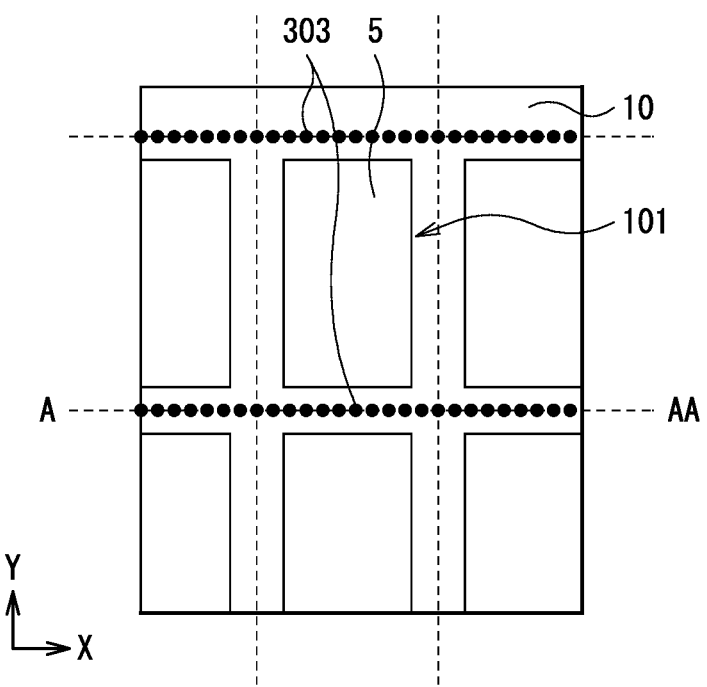

[ FIG. 11 ]
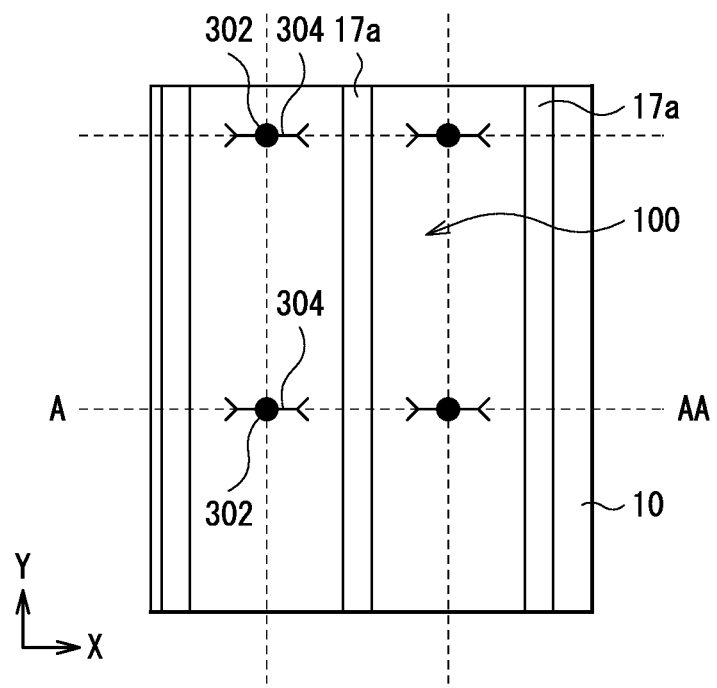

SEMICONDUCTOR LASER AND METHOD OF MANUFACTURING SEMICONDUCTOR LASER

TECHNICAL FIELD

The present disclosure relates to a semiconductor laser and a method of manufacturing a semiconductor laser.

BACKGROUND ART

In recent years, semiconductor lasers have been utilized in a variety of fields. The semiconductor laser amplifies laser light by using an end surface of the semiconductor laser orthogonal to a direction of propagation of the laser light as a reflecting surface of a resonator.

Such a semiconductor laser is manufactured by, for example, forming a plurality of laser structures on a semiconductor substrate and thereafter dividing the semiconductor substrate into individual laser structures. The semiconductor substrate is divided by, for example, cleaving the semiconductor substrate along a crystal plane derived from the crystal structure (see Patent Literature 1, for example).

CITATION LIST

Patent Literature

Patent Literature 1: Japanese Unexamined Patent Application Publication No. 2011-135016

SUMMARY OF THE INVENTION

Here, for a semiconductor laser, it is desired that a characteristic of emitted laser light be improved by more appropriately performing amplification of the laser light with a resonator.

It is desirable to provide a semiconductor laser that is able to emit laser light having a superior characteristic.

A semiconductor laser according to one embodiment of the present disclosure includes: a stacked body in which a first cladding layer of a first conductivity type, a second cladding layer of a second conductivity type, and a light emission layer provided between the first cladding layer and the second cladding layer are stacked on a semiconductor substrate; and a ridge part provided as a projection structure extending in one direction at a top surface in a stacking direction of the stacked body. The stacked body is provided to have both end surfaces in the extending direction of the ridge part that each have a shape including an arc in a plan view of the stacked body from the top surface.

Further, a method of manufacturing a semiconductor laser according to one embodiment of the present disclosure includes: forming a stacked body by stacking a first cladding layer of a first conductivity type, a second cladding layer of a second conductivity type, and a light emission layer provided between the first cladding layer and the second cladding layer on a semiconductor substrate; forming a ridge part having a projection structure extending in one direction at a top surface in a stacking direction of the stacked body; forming a dividing groove from the top surface toward a depth direction, the dividing groove being curved; and subjecting the stacked body to singulation to allow both end parts in the extending direction of the ridge part to each have a shape including an arc in a plan view of the stacked body from the top surface.

According to the semiconductor laser and the method of manufacturing a semiconductor laser of the respective embodiments of the present disclosure, in the stacked body in which the first cladding layer of the first conductivity type, the second cladding layer of the second conductivity type, and the light emission layer provided between the first cladding layer and the second cladding layer are stacked on the semiconductor substrate, it is possible to provide the end surfaces in the direction in which the ridge part extends at the top surface in the stacking direction of the stacked body to each have a shape including an arc in a plan view of the stacked body from the top surface. In the semiconductor laser, it is thereby possible to provide the end surfaces of the stacked body in the extending direction of the ridge part to be generally perpendicular to a waveguide region provided in a region corresponding to the ridge part, for example.

BRIEF DESCRIPTION OF THE DRAWINGS

FIG. 1 is a schematic cross-sectional diagram illustrating a stacked structure of a semiconductor laser according to one embodiment of the present disclosure.

FIG. 2 is an explanatory diagram illustrating a crystal structure of GaN.

FIG. 3 is a plan diagram describing a planar structure of the semiconductor laser according to the embodiment.

FIG. 4A is a plan diagram illustrating an example of the planar structure of a semiconductor laser according to a modification example of the embodiment.

FIG. 4B is a plan diagram illustrating another example of the planar structure of a semiconductor laser according to a modification example of the embodiment.

FIG. 5 is a flowchart diagram illustrating a flow of a method of manufacturing the semiconductor laser according to the embodiment.

FIG. 6 is an explanatory diagram schematically illustrating an example of a cross-sectional shape of a dividing groove.

FIG. 7 is an explanatory diagram schematically illustrating a method of dividing a stacked body by using the dividing groove.

FIG. 8 is a cross-sectional view of the stacked body illustrating a specific example of the dividing groove.

FIG. 9 is a plan view of a top surface in a stacking direction of the stacked body illustrating a specific example of the dividing groove.

FIG. 10 is a plan view of a back surface opposite to the top surface of the stacked body illustrating a specific example of the dividing groove.

FIG. 11 is a plan view of the top surface in the stacking direction of the stacked body illustrating a modification example of the dividing groove.

MODES FOR CARRYING OUT THE INVENTION

In the following, description is given in detail of embodiments of the present disclosure with reference to the drawings. The embodiments described in the following are specific examples of the present disclosure, and the technology according to the present disclosure is not limited to the following modes. In addition, arrangements, dimensions, dimensional ratios, and the like of components in the present disclosure are not limited to the modes illustrated in the drawings.

It is to be noted that the description is given in the following order.
1. Configuration of Semiconductor Laser
    1.1. Stacked Structure
    1.2. Planar structure
2. Method of Manufacturing Semiconductor Laser
    2.1. Outline of Manufacturing Method
    2.2. Specific Example of Dividing Groove
3. Conclusion

1. CONFIGURATION OF SEMICONDUCTOR LASER

1.1. Stacked Structure

First, with reference to FIG. 1, description is given of a stacked structure of a semiconductor laser according to an embodiment of the present disclosure. FIG. 1 is a schematic cross-sectional diagram illustrating the stacked structure of the semiconductor laser 100 according to the present embodiment. In FIG. 1, a stacking direction of the semiconductor laser 100 is defined as a Z direction; of in-plane directions of the semiconductor laser 100, a direction from a front side of a sheet plane to a rear side of the sheet plane is defined as a Y direction; and an in-plane direction of the semiconductor laser 100 orthogonal to the Y direction is defined as an X direction.

It is to be noted that description will be given hereinafter with a first conductivity type as an n type and a second conductivity type as a p type.

As illustrated in FIG. 1, the semiconductor laser 100 includes, for example, a stacked body 10 in which an epitaxial layer 2 is stacked on one surface 1a (also referred to as a top surface 1a) of a semiconductor substrate 1, an insulating layer 3 and a first electrode 4 provided on the epitaxial layer 2, and a second electrode 5 provided on another surface 1b (also referred to as a back surface 1b) of the semiconductor substrate 1 opposite to the top surface 1a.

The semiconductor substrate 1 includes, for example, a hexagonal group-III nitride semiconductor such as GaN, AlN, AlGaN, InGaN, or InAlGaN. Specifically, the semiconductor substrate 1 may be a GaN substrate of which carriers are of the n type. In the semiconductor laser 100 according to the present embodiment, the top surface 1a of the semiconductor substrate 1 on which the epitaxial layer 2, the insulating layer 3, and the first electrode 4 are stacked is a semipolar plane. The semipolar plane will be described later with reference to FIG. 2.

The epitaxial layer 2 is provided by, for example, epitaxially growing a buffer layer 11, a first cladding layer 12, a first light guide layer 13, a light emission layer 14, a second light guide layer 15, a carrier blocking layer 16, a second cladding layer 17, and a contact layer 18 in order on the top surface Ta of the semiconductor substrate 1.

The buffer layer 11 is provided, for example, as a gallium-nitride-based semiconductor layer such as an n-type GaN layer. The first cladding layer 12 is provided, for example, as a gallium-nitride-based semiconductor layer such as an n-type AlGaN layer or an n-type InAlGaN layer. The first light guide layer 13 is provided, for example, as a gallium-nitride-based semiconductor layer such as an n-type GaN layer or an n-type InGaN layer.

The light emission layer 14 includes, for example, a well layer (not illustrated) including a gallium-nitride-based semiconductor such as InGaN or InAlGaN, and a barrier layer (not illustrated) including a gallium-nitride-based semiconductor such as GaN, InGaN, or InAlGaN. Specifically, the light emission layer 14 may be provided in a multi-quantum well structure including a plurality of well layers and a plurality of barrier layers that are alternately stacked. The light emission layer 14 is a light emission region in the epitaxial layer 2, and is able to emit light in a wavelength band of, for example, 480 nm to 550 nm.

The second light guide layer 15 is provided as a gallium-nitride-based semiconductor layer such as a p-type GaN layer or a p-type InGaN layer. The carrier blocking layer 16 is an electron blocking layer, and is provided, for example, as a gallium-nitride-based semiconductor layer such as a p-type AlGaN layer.

The second cladding layer 17 is provided, for example, as a gallium-nitride-based semiconductor layer such as a p-type AlGaN layer or a p-type InAlGaN layer. A ridge part 17a is provided on a first-electrode-4 side of the second cladding layer 17. The ridge part 17a is a projection structure extending in the Y direction from the front side of the sheet plane to the rear side of the sheet plane of FIG. 1, and is provided by excavating a region of a surface of the second cladding layer 17 on the first-electrode-4 side other than a region corresponding to the ridge part 17a by etching or the like.

The ridge part 17a is provided to extend from one end surface to another end surface opposite thereto of a single semiconductor laser 100. Both end surfaces opposed to each other in the extending direction of the ridge part 17a function as reflecting surfaces of a laser resonator. In other words, a laser resonator is configured by both end surfaces provided in the extending direction of the ridge part 17a and an optical waveguide region in the epitaxial layer 2 corresponding to a plane region on which the ridge part 17a is provided. The semiconductor laser 100 is able to externally emit laser light by amplifying, with the laser resonator, light emitted from the light emission layer 14.

The contact layer 18 is provided, for example, as a gallium-nitride-based semiconductor layer such as a p-type GaN layer. The contact layer 18 is provided on the ridge part 17a of the second cladding layer 17.

The insulating layer 3 includes, for example, an insulating film such as a $SiO_2$ film. The insulating layer 3 is provided on a region of the second cladding layer 17 other than the ridge part 17a and on side surfaces of the ridge part 17a and the contact layer 18.

The first electrode 4 includes, for example, an electrically conductive film such as a Pd film. The first electrode 4 is provided on the contact layer 18 and on an end surface of the insulating layer 3 on the contact-layer-18 side. It is to be noted that the semiconductor laser 100 may further be provided with an electrically conductive film for a pad electrode that electrically couples to the first electrode 4. The electrically conductive film for the pad electrode may be provided to cover the insulating layer 3 and the first electrode 4, for example.

The second electrode 5 includes, for example, an electrically conductive film such as an Al film. The second electrode 5 is provided on the back surface 1b of the semiconductor substrate 1.

Here, with reference to FIG. 2, description is given of a crystal structure of a hexagonal group-III nitride semiconductor such as GaN and the semipolar plane of the semiconductor substrate 1. FIG. 2 is an explanatory diagram illustrating the crystal structure of GaN.

GaN has a crystal structure called a hexagonal crystal as illustrated in FIG. 2. In the hexagonal crystal structure, a first plane 201 perpendicular to a c-axis which is a growth axis is referred to as a polar plane, and a second plane 202 parallel to the c-axis is referred to as a nonpolar plane.

Further, a third plane 203 to which a direction of the normal is an axial direction inclined at a predetermined angle with respect to the c-axis in an m-axis direction is a plane having a characteristic intermediate between the first plane 201 and the second plane 202, and is therefore referred to as a semipolar plane.

In the semiconductor laser 100, the epitaxial layer 2 is epitaxially grown on a semipolar plane of the semiconductor substrate 1. For example, the epitaxial layer 2 may be epitaxially grown on a semipolar plane, such as a {2, 0, -2, 1} plane, a {1, 0, -1, 1} plane, a {2, 0, -2, -1} plane, or a {1, 0, -1, -1} plane, of the semiconductor substrate 1. In the semipolar plane, it is possible to reduce a piezoelectric field occurring in a c-axis direction while maintaining a crystal growth characteristic close to the polar plane. This makes it possible for the semiconductor laser 100 to achieve favorable crystal growth of the epitaxial layer 2 and to reduce the piezoelectric field that degrades light emission efficiency at the light emission layer 14. Accordingly, it is possible to improve a light emission characteristic.

Meanwhile, the semiconductor laser 100 is manufactured by cutting individual semiconductor lasers 100 out of a production substrate including a plurality of semiconductor lasers 100 arranged two-dimensionally. The cutting of the semiconductor lasers 100 out of the production substrate is performed by, for example, cleavage along a crystal plane of the crystal structure of each of the semiconductor substrate 1 and the epitaxial layer 2. A surface resulting from the cleavage (also referred to as a cleavage surface) is relatively flat and smooth, and is therefore suitably usable as a reflecting surface of the laser resonator in the semiconductor laser 100.

However, in a case where the epitaxial layer 2 is stacked on the semipolar plane of the semiconductor substrate 1, the cleavage surface at the time of cutting of the semiconductor lasers 100 is affected by the crystal plane of the first plane 201 (i.e., the {0, 0, 0, 1} plane). As a result, in some cases, the cleavage surface at the time of the cutting of the semiconductor lasers 100 can be the first plane 201, thus not being a plane perpendicular to the light emission layer 14 (i.e., the third plane 203) as illustrated in FIG. 2. In such a case, the cleavage surface in an end surface of the light emission layer 14 is lower in function as a reflecting surface of the laser resonator, thus leading to a substantial decrease in reflectance, or an increase in guiding loss of the laser light. As a result, degradation in light emission characteristic of the laser light or an increase in characteristic variations from one element to another occurs in the semiconductor laser 100.

The technology according to the present disclosure has been conceived in view of the above circumstances. The technology according to the present disclosure is to provide an end surface functioning as a reflecting surface of the laser resonator in the semiconductor laser 100 in a shape including an arc. The technology according to the present disclosure makes it possible to improve perpendicularity of the cleavage surface and the extending direction of the optical waveguide region to each other.

1.2. Planar Structure

In the following, description is given of details of the technology according to the present disclosure with reference to FIG. 3. FIG. 3 is a plan diagram describing a planar structure of the semiconductor laser 100 according to the present embodiment. In FIG. 3, a right-and-left direction when facing the drawing corresponds to the X direction, and an up-and-down direction when facing the drawing corresponds to the Y direction. Further, in FIG. 3, a direction from the rear side of the sheet plane to the front side of the sheet plane corresponds to the Z direction.

As illustrated in FIG. 3, in the semiconductor laser 100, the stacked body 10 is provided in a longitudinal shape that extends in the direction in which the ridge part 17a extends (the Y direction in FIG. 3) in a plan view from a stacking direction in which the epitaxial layer 2 is stacked on the semiconductor substrate 1 (hereinafter, also referred to simply as the stacking direction). More specifically, the stacked body 10 is provided in a substantially rectangular shape that extends in the extending direction of the ridge part 17a.

Further, the ridge part 17a is provided to extend from one end surface 6 to another end surface 6 of the stacked body 10 in substantially the middle in a lateral direction (the X direction in FIG. 3) of the stacked body 10 in a plan view from the stacking direction. It is to be noted that the unillustrated first electrode 4 is provided on the ridge part 17a.

The end surfaces 6 of the stacked body 10 in the direction in which the ridge part 17a extends are each provided to have a shape including an arc in a plan view from the stacking direction. Specifically, the end surfaces 6 may each be provided to form an arc that is concave with respect to the stacked body 10 from respective corners of the substantially rectangular shape of the stacked body 10 in a plan view from the stacking direction. With this configuration, in the ridge part 17a provided in substantially the middle in the lateral direction of the stacked body 10, the arcs that the end surfaces 6 form are reduced in radius of curvature, and the end surfaces 6 thus become substantially flat. Accordingly, the end surfaces 6 of the stacked body 10 in the direction in which the ridge part 17a extends are each able to have the function as a reflecting surface of the laser resonator.

For example, the end surfaces 6 may each be provided in an arc that has a radius of curvature of 5 mm or more and that is concave with respect to the stacked body 10 in a plan view from the stacking direction. In such a case, in the ridge part 17a provided in substantially the middle in the lateral direction of the stacked body 10, the end surfaces 6 each become substantially perpendicular to the waveguide region, thus being able to have a more favorable shape as a reflecting surface of the laser resonator.

The end surfaces 6 of the stacked body 10 described above are formed by providing a dividing groove for guiding, which is provided when cutting the semiconductor lasers 100 out of the production substrate including a plurality of semiconductor lasers 100 arranged two-dimensionally, to be curved in the extending direction of the ridge part 17a. Specifically, the dividing groove for guiding, which is provided in the stacked body 10 when dividing the production substrate into the semiconductor lasers 100, is provided to be curved toward the stacked body 10 to thereby perform dividing. This makes it possible to form the end surfaces 6 that are not along the crystal plane of the first plane 201 in FIG. 2. By virtue of this, in the semiconductor laser 100, it is possible to form the end surfaces 6 that are not along the crystal plane of the first plane 201 in FIG. 2 by dividing. Accordingly, it is possible to improve the perpendicularity of the end surfaces 6 to the in-plane direction of the light emission layer 14.

Such dividing makes it possible for the end surfaces 6 to be formed as smooth divided surfaces with irregularities of a magnitude of 0.1 μm or smaller. Further, in a case of using the end surfaces 6 as reflecting surfaces of the laser resonator in the semiconductor laser 100, irregularities of 0.02 μm or more are allowed and therefore the magnitude of irregularities of the end surfaces 6 may be greater than or equal to 0.02 µm and smaller than or equal to 0.1 µm. The end surfaces 6 having such irregularities are suitably usable as reflecting surfaces of the laser resonator in the semiconductor laser 100.

It is to be noted that the end surfaces 6 may each be provided in a shape including the arc described above in a region from the top surface at which the ridge part 17a is provided to at least a depth at which the light emission layer 14 is provided. For example, the end surfaces 6 may each be provided in a shape including the arc described above in a region from the top surface at which the ridge part 17a is provided to a depth of at least 2 µm. It is the end surfaces 6 of the stacked body 10 present in the in-plane direction of the light emission layer 14 that function as the reflecting surfaces of the laser resonator. Accordingly, it is preferable that the end surfaces 6 each have a shape including the arc described above in the region from the top surface at which the ridge part 17a is provided to at least the depth at which the light emission layer 14 is provided. Meanwhile, the end surfaces 6 of the first light guide layer 13, the first cladding layer 12, the buffer layer 11, and the semiconductor substrate 1 below the light emission layer 14 in the stacked body 10 may be end surfaces resulting from dividing along the crystal plane of the first plane 201 in FIG. 2.

Furthermore, as illustrated in FIG. 3, a groove section part 7 is provided at each of the corners of the substantially rectangular shape of the stacked body 10 in a plan view from the stacking direction.

The groove section part 7 is a remaining portion of the dividing groove for guiding which is provided at the time of dividing the production substrate formed by two-dimensionally arranging a plurality of semiconductor lasers 100 into the individual semiconductor lasers 100. Specifically, the groove section part 7 is a remaining portion of a sidewall face of the groove that is provided from the top surface of the stacked body 10, at which the ridge part 17a is provided, toward the depth direction in such a manner as to be curved. For example, the groove section part 7 may be a sidewall face that is curved from the top surface of the stacked body 10 toward the extending direction of the ridge part 17a.

The groove section part 7 may be provided at a distance from the ridge part 17a. For example, the groove section part 7 may be provided at a distance of 10 µm or more from the ridge part 17a. One reason for this is that the dividing groove for guiding including the groove section part 7 can cause damage to the stacked body 10 therearound in a process of forming the dividing groove for guiding. By providing the groove section part 7 at a distance from the ridge part 17a, it is possible to prevent damage to a region contributing to light emission that is provided in the region corresponding to the ridge part 17a.

It is to be noted that details of the dividing groove for guiding which is provided at the time of dividing the production substrate into the individual semiconductor lasers 100 will be described later in a section of a method of manufacturing the semiconductor laser 100.

Next, with reference to FIGS. 4A and 4B, description is given of modification examples of the semiconductor laser 100 according to the present embodiment. FIG. 4A is a plan diagram illustrating an example of the planar structure of the semiconductor laser 100 according to a modification example. FIG. 4B is a plan diagram illustrating another example of the planar structure of the semiconductor laser 100 according to a modification example. In FIGS. 4A and 4B, a configuration of the stacked body 10 in one of the extending directions of the ridge part 17a is extracted and illustrated.

As illustrated in FIG. 4A, in a semiconductor laser 100A, an end surface 6A in the direction in which the ridge part 17a extends is provided to have a shape including a plurality of arcs in a plan view from the stacking direction. Specifically, the end surface 6A may have a shape in which a rectangular shape with rounded corners smaller than the substantially rectangular shape of the stacked body 10 is excavated into a concavity in a plan view from the stacking direction. According to the present modification example, the shape of the end surface 6A in a plan view from the stacking direction may include only an arc, may include a plurality of arcs, or may include an arc and a straight line as long as the end surface 6A becomes substantially flat in the region in which the ridge part 17a is provided.

As illustrated in FIG. 4B, in a semiconductor laser 100B, an end surface 6B of the stacked body 10 in the direction in which the ridge part 17a extends is provided to be convex with respect to the stacked body 10 in a plan view from the stacking direction. Specifically, the end surface 6B may be provided to form an arc that is convex with respect to the stacked body 10 from the respective corners of the substantially rectangular shape of the stacked body 10 in a plan view from the stacking direction. It is possible to form such an end surface 6B by providing the dividing groove for guiding, which is provided in the stacked body 10 at the time of dividing the production substrate into the semiconductor lasers 100, to be curved away from the stacked body 10. According to the present modification example, the shape of the end surface 6B in a plan view from the stacking direction may be a concave shape with respect to the stacked body 10 or a convex shape with respect to the stacked body 10 as long as the end surface 6B becomes substantially flat in the region in which the ridge part 17a is provided.

2. METHOD OF MANUFACTURING SEMICONDUCTOR LASER

2.1. Outline of Manufacturing Method

Next, with reference to FIGS. 5 to 7, description is given of a method of manufacturing the semiconductor laser 100 according to one embodiment of the present disclosure. FIG. 5 is a flowchart diagram illustrating a flow of the method of manufacturing the semiconductor laser 100 according to the present embodiment.

As illustrated in FIG. 5, first, the semiconductor substrate 1 for forming a plurality of semiconductor lasers 100 in a two-dimensional arrangement is prepared (S100). The semiconductor substrate 1 is a substrate including, for example, a hexagonal group-III nitride semiconductor, and having the top surface 1a serving as a semipolar plane. The semipolar plane of the prepared semiconductor substrate 1 is cleaned by thermal cleaning or the like.

Next, the epitaxial layer 2 is formed (S110) by epitaxially growing various semiconductor layers in order on the semipolar plane of the semiconductor substrate 1 by means of, for example, an MOCVD (Metal Organic Chemical Vapor Deposition) method. Specifically, the buffer layer 11, the first cladding layer 12, the first light guide layer 13, the light emission layer 14, the second light guide layer 15, the carrier blocking layer 16, the second cladding layer 17, and the contact layer 18 are epitaxially grown in order on the top surface 1a of the semiconductor substrate 1.

Subsequently, within a surface region of the contact layer 18, a mask is provided on a region in which the ridge part 17a is to be formed, and the ridge part 17a is formed (S120) in each of the semiconductor lasers 100 by etching the contact layer 18 and the second cladding layer 17 in a region other than the region on which the mask is provided. Thereafter, the mask is removed and the insulating layer 3 is formed on the surfaces of the contact layer 18 and the second cladding layer 17 by means of a vapor deposition method or a sputtering method.

Next, the contact layer 18 is exposed by removing the insulating layer 3 on the ridge part 17a by means of a photolithography technique, following which the first electrode 4 is formed (S130) on the exposed contact layer 18 by means of a vapor deposition method or a sputtering method. Thereafter, the back surface 1b of the semiconductor substrate 1 is polished until the semiconductor substrate 1 achieves a desired thickness (for example, about 70 μm to about 80 μm), following which the second electrode 5 is formed on the back surface 1b of the semiconductor substrate 1 by means of a vapor deposition method or a sputtering method.

Subsequently, at the top surface in the stacking direction of the stacked body 10 including the semiconductor substrate 1 and the epitaxial layer 2 that are stacked, the dividing groove (also referred to as a scribe line) is formed (S140) at each corner of formation regions of the semiconductor lasers 100 adjacent to each other in the extending direction of the ridge part 17a. Specifically, the dividing groove is provided at each corner of the formation regions of the semiconductor lasers 100 in the depth direction from the top surface in the stacking direction of the stacked body 10 in such a manner as to be curved.

Here, a cross-sectional shape of the dividing groove will be described with reference to FIG. 6. FIG. 6 is an explanatory diagram schematically illustrating an example of the cross-sectional shape of a dividing groove 300.

As illustrated in FIG. 6, the dividing groove 300 is provided from the top surface in the stacking direction of the stacked body 10 toward the depth direction to allow an end thereof to be curved. Specifically, the dividing groove 300 may be provided to allow an angle θ of a straight line passing through a center of the dividing groove 300 to satisfy $0°<θ<75°$, preferably $10°<θ<45°$ in a cross section of the dividing groove 300 taken along a curving direction. Further, the curving direction of the dividing groove 300 may be, for example, the Y direction which is the extending direction of the ridge part 17a (that is, a direction toward the crystal plane of the first plane 201 in FIG. 2).

It is possible to form such a dividing groove 300 by, for example, laser ablation. Laser ablation is a technique of processing an object by causing the object at a laser-light-irradiation position to evaporate with heat when the object absorbs laser light applied thereto. For example, it is possible to perform laser ablation on the stacked body 10 by using a laser of a wavelength of 355 nm that a group-III nitride semiconductor is able to absorb.

Specifically, laser light emitted from an oscillator is allowed to be incident on a principal surface of a quarter-wave plate with a plane of polarization inclined at 45o to thereby generate circularly polarized laser light. By condensing the generated circularly polarized laser light with a lens or the like and applying it to the stacked body 10, it is possible to form the dividing groove 300 with an end thereof having a curved shape. A curve angle of the dividing groove 300 is changeable, for example, by a ratio between circularly polarized light and linearly polarized light that are included in the laser light used in the laser ablation.

It is to be noted that as long as it is possible to form the dividing groove 300 having the curved shape, the dividing groove 300 may be formed by means of dry etching or the like, instead of laser ablation.

Furthermore, in order for dividing of the stacked body 10 at a later stage to be performed more smoothly, a dividing groove of another shape may further be provided. For example, a dividing groove that penetrates through the stacked body 10, or a back-surface dividing groove that is excavated from the back surface of the stacked body 10 opposite to the top surface in the stacking direction may further be provided. Specific examples of the dividing grooves to be provided in the stacked body 10 will be described later with reference to FIGS. 8 to 10.

Next, the stacked body 10 including a plurality of semiconductor lasers 100 arranged two-dimensionally is divided (cleaved) by using the dividing groove, and the semiconductor lasers 100 adjacent to each other in the extending direction of the ridge part 17a are separated from each other, whereby the stacked body 10 is processed into a bar shape (S150). Specifically, it is possible to process the stacked body 10 into a bar shape by placing a blade onto the back surface of the stacked body 10 and dividing the stacked body 10 in such a manner as to open the stacked body 10 from the top surface in the stacking direction.

Here, a method of dividing the stacked body 10 by using the dividing groove will be described with reference to FIG. 7. FIG. 7 is an explanatory diagram schematically illustrating the method of dividing the stacked body 10 by using the dividing groove.

As illustrated in FIG. 7, it is possible to perform dividing of the stacked body 10, through the use of a breaking apparatus, by supporting the stacked body 10 using two support blades 401 and 402 with the back surface facing upward, and by placing a blade 403 onto an intended dividing position from the back surface. The intended dividing position is, for example, a boundary between the formation regions of the semiconductor lasers 100 including each corner at which the dividing groove is provided. The top surface in the stacking direction (that is, the surface opposite to the back surface on which the blade 403 is placed) of the stacked body 10 is thereby so divided (cleaved) as to open, and the stacked body 10 is thus divided into a bar shape.

The end surfaces 6 of the stacked body 10 in the extending direction of the ridge part 17a are thereby formed to be smooth and flat, thus becoming able to be used as reflecting surfaces of the laser resonator. Further, in the method of manufacturing the semiconductor laser 100 according to the present embodiment, the dividing groove is curved toward the crystal plane of the first plane 201 in the depth direction of the stacked body 10. This makes it possible for the stacked body 10 to be so divided as not to be along the crystal plane of the first plane 201. Accordingly, the end surfaces 6 of the stacked body 10 thus divided each have a shape including an arc, and therefore, in the region in which the ridge part 17a is provided, the end surfaces 6 become substantially flat surfaces orthogonal to the extending direction of the ridge part 17a. The method of manufacturing the semiconductor laser 100 according to the present embodiment therefore makes it possible to obtain end surfaces that are not inclined with respect to the waveguide region of the laser resonator.

Subsequently, the semiconductor lasers 100 are subjected to singulation into individual chips (S160) by cutting the stacked body 10 that has been processed into a bar shape and separating the semiconductor lasers 100 from each other. Thereafter, the semiconductor laser 100 having undergone the singulation is assembled together with a control circuit, a power supply circuit, etc. and is thereby manufactured as a product (S170).

2.2. Specific Example of Dividing Groove

Next, with reference to FIGS. 8 to 10, description is given of specific examples of the dividing groove to be provided by the method of manufacturing the semiconductor laser 100 according to the present embodiment.

Each of FIGS. 8 to 10 is a cross-sectional view or a plan view of the stacked body 10 illustrating a specific example of the dividing groove. FIG. 8 is a cross-sectional view of the stacked body 10 taken along the Z direction at a boundary between adjacent formation regions of the semiconductor lasers 100. FIG. 9 is a plan view of the top surface in the stacking direction of the stacked body 10, and FIG. 10 is a plan view of the back surface opposite to the top surface in the stacking direction of the stacked body 10. For example, the cross-sectional view illustrated in FIG. 8 corresponds to a cross-sectional view taken along line A-AA in the plan view illustrated in each of FIGS. 9 and 10. In FIGS. 8 to 10, the stacking direction of the stacked body 10 is defined as the Z direction, the extending direction of the ridge part 17a is defined as the Y direction, and the direction orthogonal to the Z direction and the Y direction is defined as the X direction.

As illustrated in FIGS. 8 to 10, at the boundary between the formation regions of the semiconductor lasers 100 adjacent to each other in the Y direction, the dividing groove 300 is formed by laser ablation or the like to divide (cleave) the stacked body 10 to obtain the reflecting surfaces of the laser resonators in the semiconductor lasers 100. Specifically, the dividing groove 300 includes a curved dividing groove 301, a through dividing groove 302, and a back-surface dividing groove 303.

The curved dividing groove 301 is provided between adjacent semiconductor lasers 100 at the top surface of the stacked body 10 to have an end curved in the extending direction of the ridge part 17a. For example, the curved dividing groove 301 may be provided at the boundary between the formation regions of the semiconductor lasers 100 located at a distance of 10 µm or more in the X direction from the ridge part 17a to have a depth greater than or equal to 5 µm and smaller than or equal to 40 µm. In a case where the depth of the curved dividing groove 301 falls within the above-described range, it is possible to easily divide the stacked body 10 and to prevent excessive damage to the stacked body 10. To suppress damage to the stacked body 10, a width in the Y direction of the curved dividing groove 301 is preferably as small as possible, and is preferably smaller than or equal to 5 µm, for example. The curve angle of the curved dividing groove 301 may be, for example, greater than 0° and smaller than 75°, preferably greater than 100 and smaller than 45°. By providing the curved dividing groove 301, the stacked body 10 is divided to allow the semiconductor lasers 100 resulting from the dividing to have end surfaces each including a desired arc.

The through dividing groove 302 is provided through the stacked body 10 from the top surface to the back surface of the stacked body 10. For example, the through dividing groove 302 may be provided at a point of intersection of the boundaries between the formation regions of the semiconductor lasers 100 to have a width in the X direction greater than or equal to 3 µm and smaller than or equal to 30 µm, and a width in the Y direction smaller than or equal to 10 µm. The through dividing groove 302 is a dividing groove that is more effective in allowing the end surfaces 6 of the stacked body 10 to each have a shape including an arc in a plan view from the stacking direction. By providing the through dividing groove 302, the stacked body 10 is divided to allow the end surfaces 6 to each have a shape including an arc more easily.

A plurality of back-surface dividing grooves 303 is provided at small intervals between adjacent semiconductor lasers 100 at the back surface of the stacked body 10. For example, the back-surface dividing grooves 303 may be provided by forming grooves having a width in the X direction of about 8 µm and a depth of 35 µm in a dashed-line manner with a spacing of about 2 µ between adjacent grooves at the boundary between the formation regions of the semiconductor lasers 100 adjacent to each other in the Y direction. Providing the back-surface dividing grooves 303 results in more easy dividing of the stacked body 10.

It is to be noted that these dividing grooves 300 are formable by dry etching instead of laser ablation. A modification example of forming the dividing grooves 300 by dry etching will be described with reference to FIG. 11. FIG. 11 is a plan view of the stacked body 10 illustrating the modification example of the dividing grooves 300. FIG. 11 illustrates a plan view of the top surface in the stacking direction of the stacked body 10 in a case where dry etching is used. In FIG. 11, the stacking direction of the stacked body 10 is defined as the Z direction, the extending direction of the ridge part 17a is defined as the Y direction, and the direction orthogonal to the Z direction and the Y direction is defined as the X direction.

As illustrated in FIG. 11, in the case where the dividing grooves 300 are formed by dry etching, the dividing grooves 300 include a guide dividing groove 304 instead of the curved dividing groove 301.

The guide dividing groove 304 is a groove having a plan shape that promotes dividing (cleaving) to allow the end surfaces 6 of the semiconductor lasers 100 adjacent to each other in the Y direction to each have a shape including an arc. Specifically, the guide dividing groove 304 is provided at the boundary between the formation regions of the semiconductor lasers 100 located away from the ridge part 17a in the X direction, and is provided with an end part shaped to turn to obliquely intersect the ridge part 17a. For example, the guide dividing groove 304 may be provided in a linear shape with both end parts bifurcated with respect to the ridge part 17a. Providing the guide dividing groove 304 allows dividing of the end surfaces in the Y direction of the semiconductor laser 100 to be performed obliquely from the respective corners of the formation region of the semiconductor laser 100 toward the ridge part 17a. This makes it easier for the end surfaces in the Y direction of the semiconductor laser 100 to be each formed into a shape in which the corners of the formation region of the semiconductor laser 100 are connected by an arc. Accordingly, even in a case of using such a manufacturing method, it is possible to manufacture the semiconductor laser 100 according to the present embodiment.

3. CONCLUSION

As has been described hereinabove, in the semiconductor laser 100 according to the present embodiment, each of the end surfaces 6 in the extending direction of the ridge part 17a is shaped to include an arc, and it is thereby possible to obtain a reflecting surface of the laser resonator that is not inclined with respect to the optical waveguide region. This makes it possible for the semiconductor laser 100 to achieve an improved light emission characteristic of laser light and to suppress characteristic variations. Specifically, it is possible for the semiconductor laser 100 to suppress threshold current value, slope efficiency, and variations of these characteristics. Further, it is possible for the semiconductor laser 100 to suppress an optical axis deviation of an FFP (Far Field Pattern) spectrum and variations of the characteristic.

Further, with the semiconductor laser 100 according to the present embodiment, it is possible to suppress irregularities of the reflecting surface of the laser resonator. This makes it possible for the semiconductor laser 100 to be improved in resistance to electrostatic discharge (Electro Static Discharge: ESD), resistance to catastrophic optical damage (Catastrophic Optical Damage: COD), and long-term reliability.

The technology according to the present disclosure has been described hereinabove with reference to the embodiments and the modification examples. However, the technology according to the present disclosure is not limited to the embodiments and the like described above, and may be modified in a variety of ways. For example, the technology according to the present disclosure is also applicable to a semiconductor laser that uses an AlGaAs/GaAs-based material.

Furthermore, not all of the configurations and operations described in each of the embodiments are indispensable as the configurations and operations of the present disclosure. For example, among the components of each of the embodiments, any component that is not recited in an independent claim which represents the most generic concept of the present disclosure is to be understood as an optional component.

Terms used throughout this specification and the appended claims should be construed as "non-limiting" terms. For example, the term "including" or "included" should be construed as "not limited to what is described as being included". The term "having" should be construed as "not limited to what is described as being had".

The terms used herein are used merely for the convenience of description and include terms that are not used to limit the configuration and the operation. For example, the terms such as "right", "left", "up", and "down" only indicate directions in the drawings being referred to. In addition, the terms "inside" and "outside" only indicate a direction toward the center of a component of interest and a direction away from the center of a component of interest, respectively. The same applies to terms similar to these and to terms with the similar purpose.

It is to be noted that the technology according to the present disclosure may have the following configurations. The technology according to the present disclosure having the following configurations makes it possible for the end surfaces of the stacked body in the extending direction of the ridge part to be non-inclined, substantially perpendicular end surfaces with respect to the optical waveguide region. This makes it possible for the laser resonator of the semiconductor laser to achieve a more favorable characteristic. Such a semiconductor laser makes it possible to improve the characteristic of laser light to be emitted and reduce characteristic variations. Effects attained by the technology according to the present disclosure are not necessarily limited to the effects described herein, but may include any of the effects described in the present disclosure.

(1)
A semiconductor laser including:
a stacked body in which a first cladding layer of a first conductivity type, a second cladding layer of a second conductivity type, and a light emission layer provided between the first cladding layer and the second cladding layer are stacked on a semiconductor substrate; and
a ridge part provided as a projection structure extending in one direction at a top surface in a stacking direction of the stacked body, in which
the stacked body is provided to have both end surfaces in the extending direction of the ridge part that each have a shape including an arc in a plan view of the stacked body from the top surface.

(2)
The semiconductor laser according to (1), in which a plan shape of the stacked body in the plan view from the top surface is a longitudinal shape that extends in the extending direction.

(3)
The semiconductor laser according to (2), in which the both end surfaces of the stacked body in the extending direction are provided to be convex or concave with respect to the stacked body.

(4)
The semiconductor laser according to (3), in which the both end surfaces are provided to be substantially flat in a region corresponding to the ridge part.

(5)
The semiconductor laser according to (4), in which, in the region corresponding to the ridge part, the both end surfaces are provided to be substantially flat to at least a depth at which the light emission layer is provided.

(6)
The semiconductor laser according to (4) or (5), in which, in the region in which the both end surfaces are substantially flat, the both end surfaces have irregularities of a magnitude greater than or equal to 0.02 µm and smaller than or equal to 0.1 µm.

(7)
The semiconductor laser according to any one of (2) to (6), in which a groove section part that is curved is provided at a corner of the longitudinal shape of the stacked body from the top surface of the stacked body toward a depth direction.

(8)
The semiconductor laser according to (7), in which the groove section part is curved toward the extending direction.

(9)
The semiconductor laser according to (7) or (8), in which the groove section part is provided at a distance from the ridge part.

(10)
The semiconductor laser according to any one of (7) to (9), in which the groove section part is provided through the stacked body.

(11)
The semiconductor laser according to any one of (1) to (10), in which a back-surface groove section part is further provided in the stacked body at a back surface opposed to the top surface.

(12)
The semiconductor laser according to any one of (1) to (11), in which the first cladding layer, the second cladding layer, and the light emission layer are stacked on a semipolar principal surface of the semiconductor substrate.

(13)
The semiconductor laser according to any one of (1) to (12), in which the semiconductor substrate includes a hexagonal group-III nitride semiconductor.

(14)
A method of manufacturing a semiconductor laser, including:
  forming a stacked body by stacking a first cladding layer of a first conductivity type, a second cladding layer of a second conductivity type, and a light emission layer provided between the first cladding layer and the second cladding layer on a semiconductor substrate;
  forming a ridge part having a projection structure extending in one direction at a top surface in a stacking direction of the stacked body;
  forming a dividing groove from the top surface toward a depth direction, the dividing groove being curved; and
  subjecting the stacked body to singulation to allow both end parts in the extending direction of the ridge part to each have a shape including an arc in a plan view of the stacked body from the top surface.

(15)
The method of manufacturing a semiconductor laser according to (14), in which the dividing groove is formed by laser ablation.

(16)
The method of manufacturing a semiconductor laser according to (15), in which the laser ablation is performed with a circularly polarized laser.

(17)
The method of manufacturing a semiconductor laser according to any one of (14) to (16), in which a curve angle of the dividing groove is greater than 0° and smaller than 75°.

(18)
The method of manufacturing a semiconductor laser according to any one of (14) to (17), in which the singulation of the stacked body is performed by cleaving the stacked body.

This application claims the benefit of Japanese Priority Patent Application JP2019-210558 filed with the Japan Patent Office on Nov. 21, 2019, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A semiconductor laser comprising:
  a stacked body in which a first cladding layer of a first conductivity type, a second cladding layer of a second conductivity type, and a light emission layer provided between the first cladding layer and the second cladding layer are stacked on a semiconductor substrate; and
  a ridge part provided as a projection structure extending in one direction at a top surface in a stacking direction of the stacked body, in which
  the stacked body is provided to have both end surfaces in the extending direction of the ridge part that each have a shape including an arc in a plan view of the stacked body from the top surface,
  a plan shape of the stacked body in the plan view from the top surface is a longitudinal shape that extends in the extending direction,
  the both end surfaces of the stacked body in the extending direction are provided to be convex or concave with respect to the stacked body,
  the both end surfaces are provided to be substantially flat in a region corresponding to the ridge part, and
  in the region in which the both end surfaces are substantially flat, the both end surfaces have irregularities of a magnitude greater than or equal to 0.02 µm and smaller than or equal to 0.1 µm.

2. The semiconductor laser according to claim 1, wherein, in the region corresponding to the ridge part, the both end surfaces are provided to be substantially flat to at least a depth at which the light emission layer is provided.

3. The semiconductor laser according to claim 1, wherein a groove section part that is curved is provided at a corner of the longitudinal shape of the stacked body from the top surface of the stacked body toward a depth direction.

4. The semiconductor laser according to claim 3, wherein the groove section part is curved toward the extending direction.

5. The semiconductor laser according to claim 3, wherein the groove section part is provided at a distance from the ridge part.

6. The semiconductor laser according to claim 3, wherein the groove section part is provided through the stacked body.

7. The semiconductor laser according to claim 1, wherein a back-surface groove section part is further provided in the stacked body at a back surface opposed to the top surface.

8. The semiconductor laser according to claim 1, wherein the first cladding layer, the second cladding layer, and the light emission layer are stacked on a semipolar principal surface of the semiconductor substrate.

9. The semiconductor laser according to claim 1, wherein the semiconductor substrate includes a hexagonal group-III nitride semiconductor.

10. A method of manufacturing a semiconductor laser, comprising:
  forming a stacked body by stacking a first cladding layer of a first conductivity type, a second cladding layer of a second conductivity type, and a light emission layer provided between the first cladding layer and the second cladding layer on a semiconductor substrate;
  forming a ridge part having a projection structure extending in one direction at a top surface in a stacking direction of the stacked body;
  forming a dividing groove from the top surface toward a depth direction, the dividing groove being curved; and
  subjecting the stacked body to singulation to allow both end parts in the extending direction of the ridge part to each have a shape including an arc in a plan view of the stacked body from the top surface, wherein
  a plan shape of the stacked body in the plan view from the top surface is a longitudinal shape that extends in the extending direction,
  the both end surfaces of the stacked body in the extending direction are provided to be convex or concave with respect to the stacked body,
  the both end surfaces are provided to be substantially flat in a region corresponding to the ridge part, and
  in the region in which the both end surfaces are substantially flat, the both end surfaces have irregularities of a magnitude greater than or equal to 0.02 µm and smaller than or equal to 0.1 µm.

11. The method of manufacturing a semiconductor laser according to claim 10, wherein the dividing groove is formed by laser ablation.

12. The method of manufacturing a semiconductor laser according to claim 11, wherein the laser ablation is performed with a circularly polarized laser.

13. The method of manufacturing a semiconductor laser according to claim 10, wherein a curve angle of the dividing groove is greater than 0° and smaller than 75°.

14. The method of manufacturing a semiconductor laser according to claim 10, wherein the singulation of the stacked body is performed by cleaving the stacked body.

15. A semiconductor laser comprising:
- a stacked body in which a first cladding layer of a first conductivity type, a second cladding layer of a second conductivity type, and a light emission layer provided as a semipolar plane between the first cladding layer and the second cladding layer are stacked on a semiconductor substrate; and
- a ridge part provided as a projection structure extending in one direction at a top surface in a stacking direction of the stacked body, in which the stacked body is provided to have both end surfaces in the extending direction of the ridge part that each have a shape including an arc in a plan view of the stacked body from the top surface, a plan shape of the stacked body in the plan view from the top surface is a longitudinal shape that extends in the extending direction, the both end surfaces of the stacked body in the extending direction are provided to be convex or concave with respect to the stacked body, the both end surfaces are provided to be substantially flat in a region corresponding to the ridge part, and in the region in which the both end surfaces are substantially flat, the both end surfaces have irregularities of a magnitude greater than or equal to 0.02 μm and smaller than or equal to 0.1 μm.

* * * * *